United States Patent [19]
Lee

[11] Patent Number: 5,787,045
[45] Date of Patent: Jul. 28, 1998

[54] INTERNAL ADDRESS GENERATOR OF SEMICONDUCTOR MEMORY DEVICE

[75] Inventor: Jae Jin Lee, Ichon, Rep. of Korea

[73] Assignee: Hyundai Electronics Industries Co., Ltd., Ichon, Rep. of Korea

[21] Appl. No.: 777,206

[22] Filed: Dec. 27, 1996

[30] Foreign Application Priority Data

Dec. 31, 1995 [KR] Rep. of Korea .............. 95-72393

[51] Int. Cl.$^6$ .................................................. G11C 13/00
[52] U.S. Cl. ........................... 365/230.01; 365/230.06
[58] Field of Search ..................... 365/189.01, 230.01, 365/230.03, 230.06, 225.7, 230.08

[56] References Cited

U.S. PATENT DOCUMENTS 5,274,594 12/1993 Yanagisawa et al. ............... 365/225.7
5,392,252 2/1995 Rimpo et al. .
5,430,686 7/1995 Tokami et al. .

Primary Examiner—Terrell W. Fears
Attorney, Agent, or Firm—Reid & Priest LLP

[57] ABSTRACT

An internal address generator of a semiconductor memory device which can achieve a high speed operation. The internal address generator includes at least two bit counters which input a less significant AND-SUM signal from a less significant bit counter and each input an external address signal of 2 bits or more by 1 bit, commonly responding to an enable signal and a clock signal, each bit counter having: a first pass transistor connected between an output terminal and a first node and being responsive to the clock signal; a first inverter for inverting a logic value from the output terminal; a second pass transistor for transmitting an output signal from the first inverter to the first node; second and third inverters parallel-coupled between the first node and a second node to form a feedback loop; fourth and fifth inverters parallel-coupled between third and fourth nodes to form a feedback loop; a third pass transistor connected between the second and third nodes; a sixth inverter connected between the fourth node and the output terminal; a clock switching part for transmitting the clock signal to the third pass transistor during a counter mode in accordance with logic values of the enable signal and the less significant AND-SUM signal; an address switching part for selectively transmitting an external address signal to the third node in accordance with the logic value of the enable signal; a loop switching part for applying the clock signal to the first pass transistor to drive the first pass transistor complementarily to the third pass transistor, during the count mode and to complementarily drive the first and second pass transistors, during a loading mode, in response to the logic values of the enable signal and the less significant AND-SUM signal; and an AND-SUM operation part for generating an AND-SUM signal by a logic signal on the third node and the less significant AND-SUM signal.

10 Claims, 8 Drawing Sheets

INTERNAL ADDRESS GENERATOR OF SEMICONDUCTOR MEMORY DEVICE

BACKGROUND OF THE INVENTION

1. Field of the Invention

The present invention relates to an internal address generator of a semiconductor memory device, and more particularly, to an internal address generator which can achieve high speed operation.

2. Description of the Prior Art

Generally, addresses are used for selecting a plurality of memory cells disposed in a memory device. The memory device decodes an address to access any one memory cell among the plurality of memory cells. In more detail, the memory device decodes the addresses of a part of bit among addresses to thereby select a row line, and then decodes the addresses of residual bits to thereby select a column line.

An internal address counter within the memory device facilitates a self-refresh operation and a page access operation. As the density of memory device increases, the voltage level thereof is reduced, and the operating speed thereof increases, the internal address counter requires a high speed operation.

However, a typical internal address counter has great difficulty in performing a high speed operation due to an increased response delay according to the number of bits of address To solve such the problem, there has been provided a novel internal address counter which is comprised of a bit counter for generating a bit address signal and an AND-SUM signal. The AND-SUM signal represents whether or not all of the output signals from less significant bit counters including the output signal of the bit counter have data "1". However, a conventional internal address generator has an disadvantage in that after an external address signal is loaded, a counting operation can not be immediately executed. This is because when the external address signal is loaded, the AND-SUM operation can not be concurrently implemented. An explanation of such the problem will be discussed in detail with reference to FIGS. 1 and 2.

FIG. 1 is a circuit diagram illustrating an internal address generator constructed according to a conventional semiconductor memory device. In the circuit, referring to FIG. 1, first to third bit counters (10, 12, 14) each receives less significant AND-SUM signal from less significant bit counter and respectively input 3-bit address signals A1 to A3 by 1 bit from an exterior of the circuit. An edge detecting part 16 inputs an enable signal EN, and a clock transmission part 18 inputs a clock signal CLK.

The edge detecting part 16 generates an edge detecting signal having a predetermined width, when the enable signal is raised, to thereby apply the edge detecting signal to the clock transmission part 18. For this end, the edge detecting part 16 is comprised of a delay 17, a NAND gate NAG1 and two inverters I1 and I2.

The clock transmission part 18 selectively applies the edge detecting signal from the edge detecting part 16 and the clock signal CLK commonly to the first to third bit counters 10 to 14. For this end, the clock transmission part 18 is comprised of a NOR gate NOG1 and an inverter I3.

Each of the first to third bit counters 10 to 14 performs a counter operation, when the enable signal EN which is supplied commonly to them is kept at the logic "high" level, and then executes a loading operation for the external address signals A1 to A3. The first bit counter 10 inverts the logic states of a first bit signal B1 and the AND-SUM signal, whenever the clock signal CLK is applied from the clock transmission part 18. In the meantime, in the case where the AND-SUM signal from the less significant bit counter is kept in the logic "high" level, the second and third bit counters 12 and 14 respectively invert the logic states of second and third bit signals B2 and B3, in response to the clock signal CLK from the clock transmission part 18, and then respectively perform an AND-SUM operation.

FIG. 2 is a detailed circuit diagram illustrating the bit counter of FIG. 1. In the circuit, the bit counter is comprised of a NAND gate NAG2 for inputting the enable signal EN, a less significant AND-SUM signal AND-SUMn-1 and the clock signal CLK, respectively, a counter part 20 and an external address switching part 22.

The NAND gate NAG2 inverts the clock signal CLK, only when both the enable signal EN and the less significant AND-SUM signal AND-SUMn-1 are kept at the logic "high" level. The NAND gate NAG2 then supplies the inverted clock signal to an inverter I4. The inverter I4 inverts the inverted clock signal from the NAND gate NAG2 and applies the reinverted clock signal to the counter part 20.

The external address switching part 22 selectively transmits an 1-bit address signal An from the exterior of circuit to the counter part 20 according to the logic value of the enable signal EN. In more detail, in the case where the enable signal EN is kept to the logic "high" level, the external address switching part 22 applies an inverted external address signal An to the counter part 20. The external address switching part is comprised of two inverters I5 and I6 and a pass transistor P1.

The counter part 20 includes a pass transistor P2 connected between an output terminal Bn and a first node N1 and an inverter I7 for inverting the clock signal CLK from the inverter I4.

The pass transistor P2 is selectively driven by the clock signal CLK from the inverter I4 and by the inverted clock signal from the inverter I4. In more detail, the pass transistor P2 transmits the logic value on the output terminal Bn to the first node N1, when the clock signal CLK is held at the logic "high" level. The first node N1 inputs an internal address signal Bn via the pass transistor P2 and the inverted external address signal An from the external address switching part 22. The counter part 20 further includes parallel-coupled inverters I8 and I9 between the first node N1 and a second node N2 to form a feedback loop, parallel-coupled inverters I10 and I11 between third and fourth nodes N3 and N4 to form a feedback loop, and a pass transistor P3 connected between the second and third nodes N2 and N3.

The inverter I8 functions as a memory device with the inverter I9 and maintains the logic value on the first node N1. The inverter I8 inverts the logic value on the first node N1 and transmits the inverted logic value to the second node N2.

The pass transistor P3 is selectively driven by the clock signal CLK from the inverter I4 and by the inverted clock signal from the inverter I7. Namely, the pass transistor P3 transmits the logic value on the second node N2 to the third node N3, when the clock signal CLK is held at the logic "low" level.

The inverter I10 functions as a memory device with the inverter I11 and maintains the logic value on the third node N3. The inverter I11 inverts the logic value on the third node N3 and transmits the inverted logic value to an inverter I12 connected to the fourth node N4. The inverter I12 inverts the logic value on the fourth node N4 and outputs the inverted logic value as an 1-bit internal address signal via the output terminal Bn.

Moreover, the bit counter further includes an AND-SUM operation part 24 which ANDs the logic signal on the third node N3 and the less significant AND-SUM signal AND-SUMn-1. After ANDing the logic signal on the third node N3 and the less significant AND-SUM signal AND-SUMn-1, the AND-SUM operation part 24 generates a new AND-SUM signal AND-SUMn indicating whether or not all the output signals from the less significant bit counters, including the output signal of its own bit counter, have data "1". The AND-SUM signal AND-SUMn generated from the AND-SUM operation part 24 has the data "1", only when the logic values of the less significant AND-SUM signal AND-SUMn-1 and the third node N3 have the data "1". The AND-SUM operation part 24 is comprised of a NAND gate NAG3 and an inverter I13.

As described in the above, the conventional internal address generator should require an additional clock signal, since the external address signal is loaded to only one memory device among two memory devices within the bit counter. Additionally, the conventional internal address generator does not change the AND-SUM signal upon loading the external address signal. Accordingly, a normal counting operation can not be immediately performed, as soon as the loading operation is completed.

SUMMARY OF THE INVENTION

Accordingly, the present invention is directed to an internal address generator of a semiconductor memory device that substantially obviates one or more of the problems due to limitations and disadvantages of the related art.

An object of the invention is to provide an internal address generator of a semiconductor memory device which is capable of having a high speed response characteristic in response to a clock signal and immediately executing a counting operation after an address load is completed.

To achieve this and other objects of the present invention, an internal address generator has at least two bit counters which each input a less significant AND-SUM signal from a less significant bit counter and each input an external address signal of 2 bits or more by 1 bit, commonly responding to an enable signal and a clock signal, each bit counter comprising: a first pass transistor connected between an output terminal and a first node and being responsive to the clock signal; a first inverter for inverting a logic value from the output terminal; a second pass transistor for transmitting an output signal from the first inverter to the first node; second and third inverters parallel-coupled between the first node and a second node to form a feedback loop; fourth and fifth inverters parallel-coupled between third and fourth nodes to form a feedback loop; a third pass transistor connected between the second and third nodes; a sixth inverter connected between the fourth node and the output terminal; a clock switching part for transmitting the clock signal to the third pass transistor, during a counter mode, in accordance with logic values of the enable signal and the less significant AND-SUM signal; an address switching part for selectively transmitting an external address signal to the third node in accordance with the logic value of the enable signal; a loop switching part for applying the clock signal to the first pass transistor to drive the first pass transistor complementarily to the third pass transistor, during the count mode, and to complementarily drive the first and second pass transistors, during a loading mode, in response to the logic values of the enable signal and the less significant AND-SUM signal; and an AND-SUM operation part for generating an AND-SUM signal by a logic signal on the third node and the less significant AND-SUM signal.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
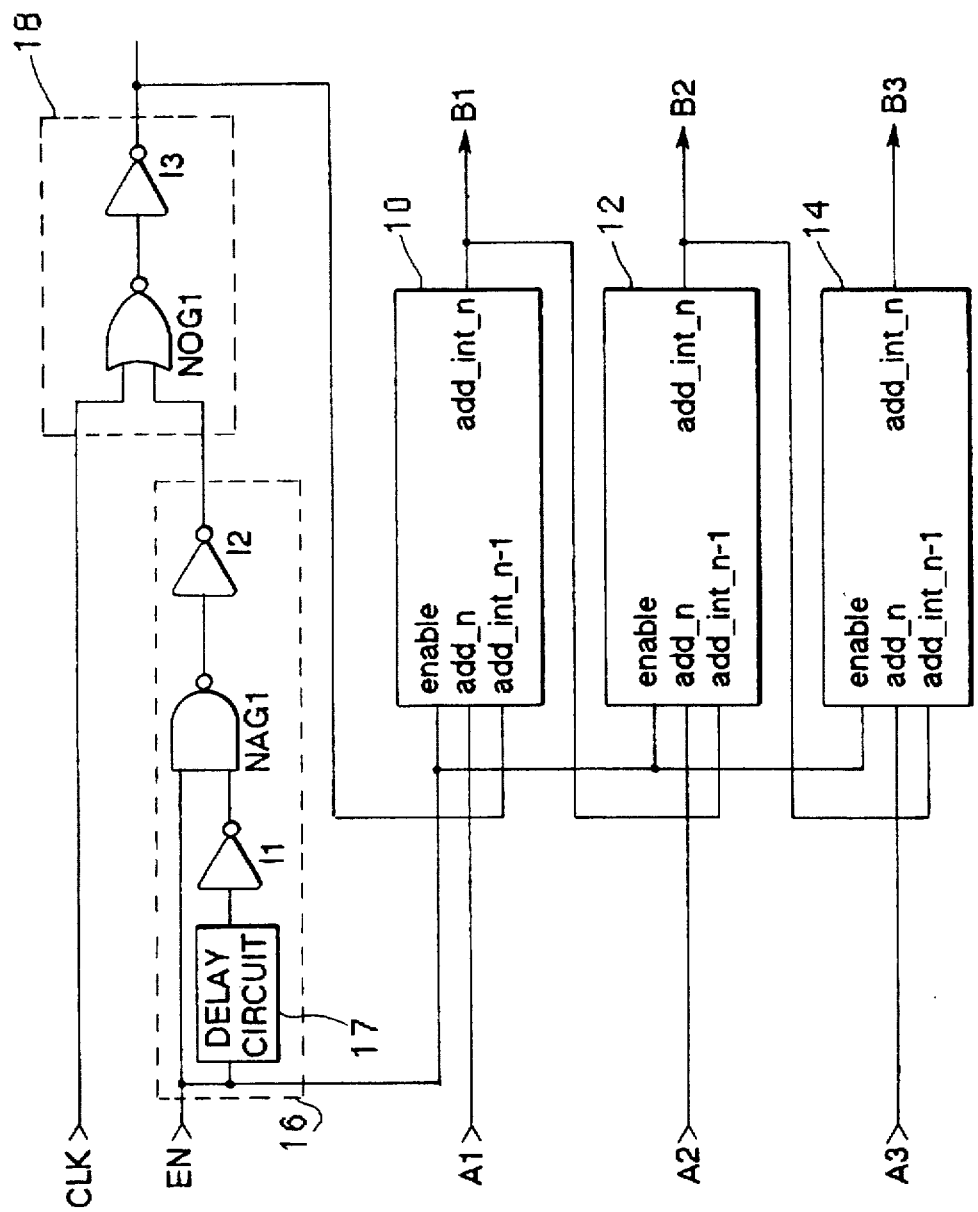
FIG. 1 is a circuit diagram illustrating an internal address generator constructed according to a conventional semiconductor memory device.
Figure 2:
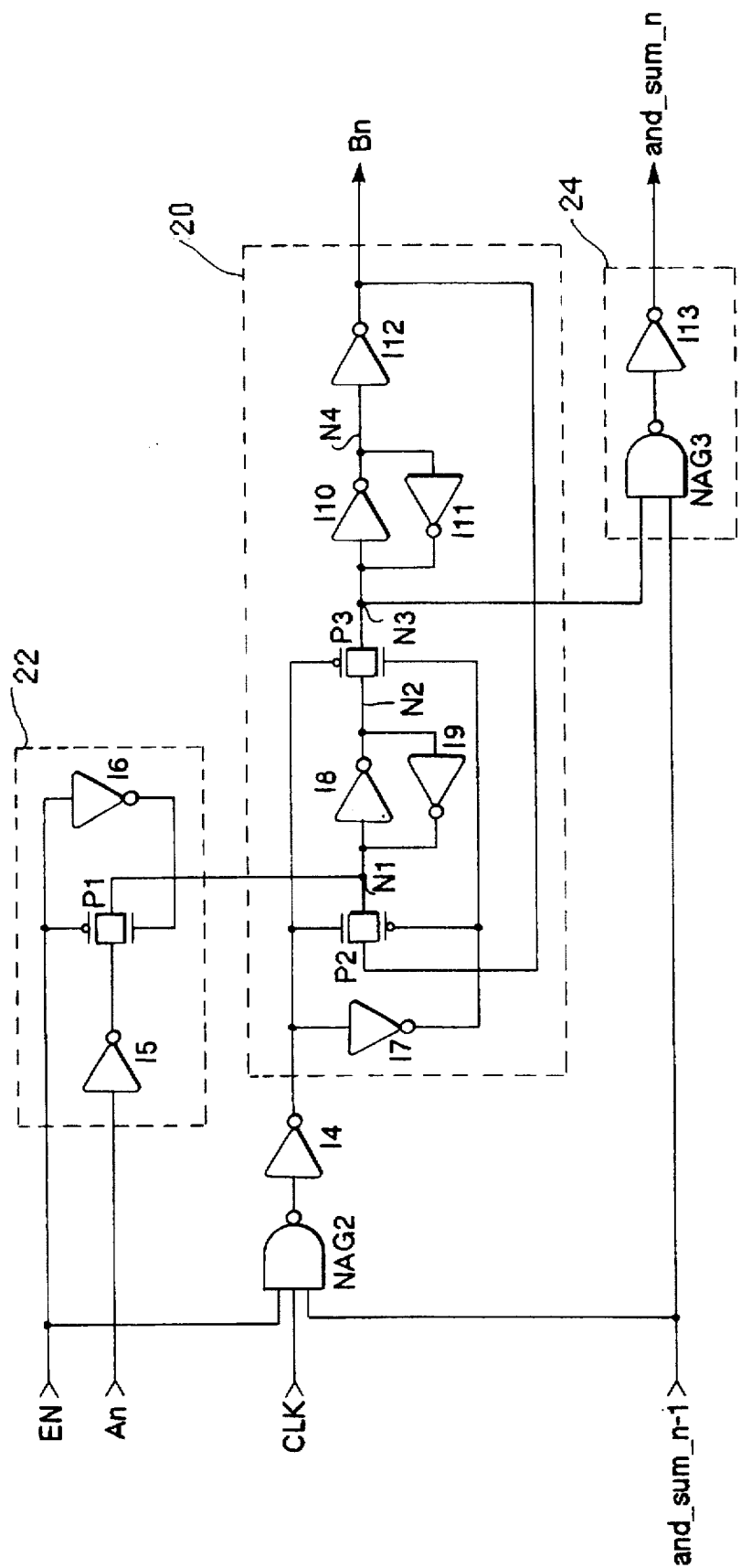
FIG. 2 is a detailed circuit diagram illustrating the bit counter of FIG. 1.
Figure 3:
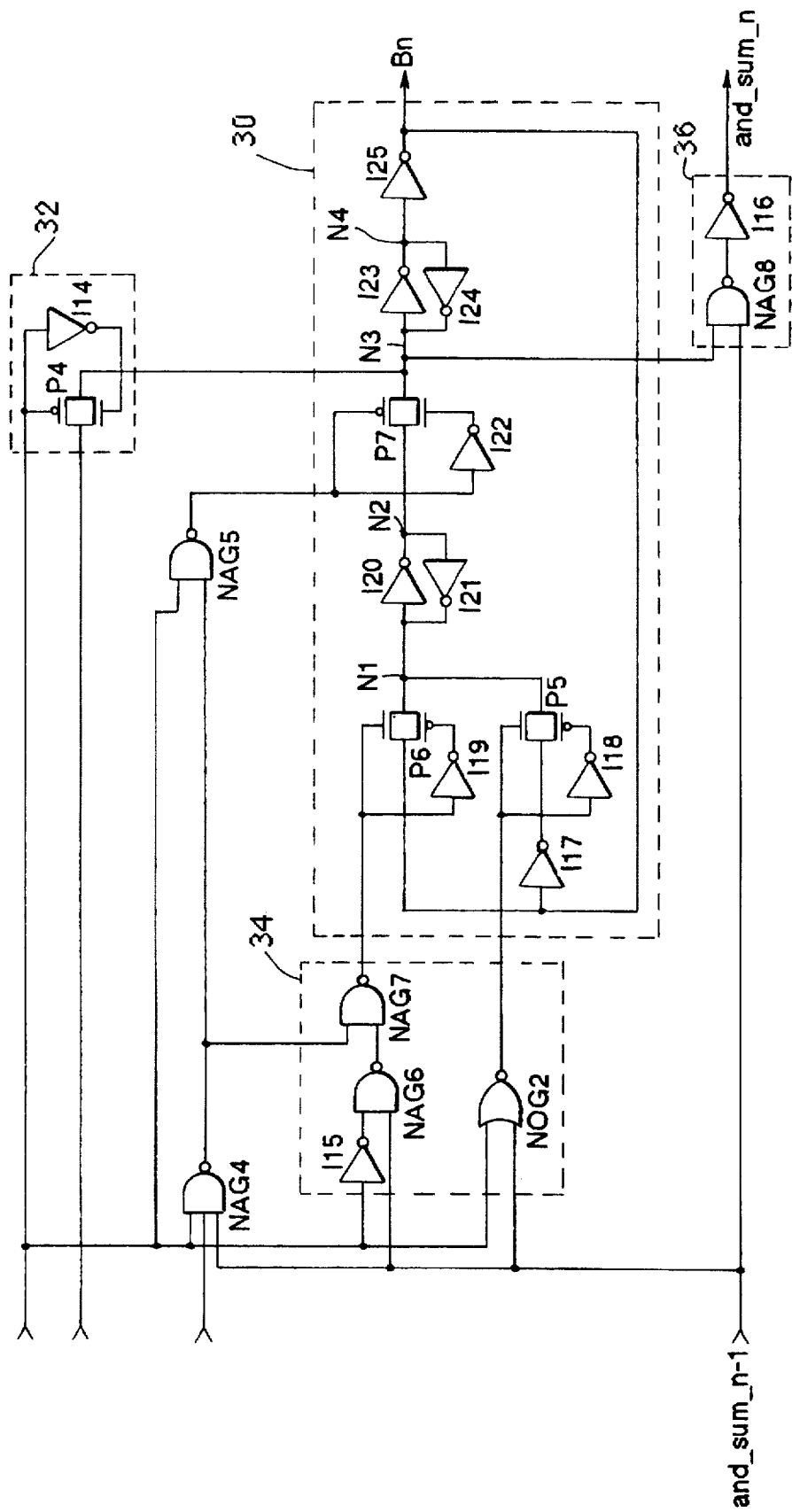
FIG. 3 is a circuit diagram illustrating a bit counter of an internal address generator according to a first embodiment of the present invention.

FIG. 3 is a circuit diagram illustrating a bit counter of an internal address generator according to a first embodiment of the present invention. Referring to FIG. 3, in the circuit, the bit counter is comprised of a NAND gate NAG4 for inputting an enable signal EN, a less significant AND-SUM signal AND-SUMn-1 and a clock signal CLK, respectively, a counter part 30 and an external address switching part 32.

The NAND gate NAG4 inverts the clock signal CLK, only when both the enable signal EN and the less significant AND-SUM signal AND-SUMn-1 are kept at the logic "high" level. The NAND gate NAG4 then supplies the inverted clock signal to a NAND gate NAG5. The NAND gate NAG5 inverts the inverted clock signal from the NAND gate NAG4, only when the enable signal EN is maintained at the logic "high" level. Namely, the NAND gate NAG5 with the NAND gate NAG4 serves to switch the clock signal CLK in accordance with the logic value of the enable signal EN.

The external address switching part 32 selectively transmits an 1-bit address signal An from the exterior of circuit to the counter part 30 according to the logic value of the enable signal EN. In more detail, in the case where the enable signal EN is kept in the logic "high" level, the external address switching part 32 supplies the external address signal An to the counter part 30. The external address switching part 32 is comprised of an inverter I14 and a pass transistor P4.

The bit counter within the internal address generator according to the present invention further includes a loop switching part 34 which inputs the less significant AND-SUM signal AND-SUMn-1, the enable signal EN and the inverted clock signal from the NAND gate NAG4. The loop switching part 34 generates first and second loop driving signals for selectively driving two loops within the counter part 30.

In the case where both the enable signal EN and the less significant AND-SUM signal AND-SUMn-1 are kept at the logic "high" level, the first loop driving signal has the same waveform as the clock signal generated from the NAND gate NAG5. Meanwhile, in the case that the enable signal EN is kept at the logic "low" level and the less significant AND-SUM signal AND-SUMn-1 is kept at the logic "high" level, the first loop driving signal holds the logic "high" level. However, when both the enable signal EN and the less significant AND-SUM signal AND-SUMn-1 are kept at the logic "low" level, and when the enable signal EN and the less significant AND-SUM signal AND-SUMn-1 are respectively kept at the logic "high" and "low" levels, the first loop driving signal holds the logic "low" level. Contrarily, when both the enable signal EN and the less significant AND-SUM signal AND-SUMn-1 are kept at the logic "low" level, the second loop driving signal holds the logic "high" level. The loop switching part 34 is comprised of NAND gates NAG6 and NAG7, an inverter I15 and a NOR gate NOG2. The NOR gate NOG2 NORs the enable signal EN and the less significant AND-SUM signal AND-SUMn-1 to generate the second loop driving signal. The NAND gate NAG6 NANDs the less significant AND-SUM signal AND-SUMn-1 and the inverted enable signal by the inverter I15. The NAND gate NAG7 NANDs the output signals from the NAND gates NAG4 and NAG6 to generate the first loop driving signal.

The counter part 30 includes a pass transistor PG which is connected between an output terminal Bn and a first node N1, an inverter I22 which inverts the clock signal CLK from the NAND gate NAG5, an inverter I19 which inverts the first loop driving signal from the NAND gate NAG7 and an inverter I18 which inverts the second loop driving signal from the NOR gate NOG7.

The pass transistor P6 is selectively driven by the first loop driving signal and the inverted first loop driving signal from the NAND gate NAG7 and inverter I19, respectively. In more detail, the pass transistor PG transmits the logic value on the output terminal Bn to the first node N1, when the first loop driving signal is held at the logic "high" level.

The counter part 30 further includes an inverter I17 which inverts the logic value from the output terminal Bn and a pass transistor P5 which transmits an output signal of the inverter I17 to the first node N1. The pass transistor P5 is selectively driven in response to the second loop driving signal and the inverted second loop driving signal from the NOR gate NOG2 and the inverter I18, respectively. The pass transistor P5 supplies an inverted signal of the logic signal on the output terminal Bn inverted by the inverter I17 to the first node N1, when the second loop driving signal is held at the logic "high" level. Namely, the pass transistor P5 is driven complementarily to the pass transistor P6 in accordance with the logic value of the less significant AND-SUM signal AND-SUMn-1, during the loading mode where the enable signal EN is kept at the logic "low" level.

The counter part 30 further includes parallel-coupled inverters I20 and I21 between the first node N1 and a second node N2 to form a feedback loop, parallel-coupled inverters I23 and I24 between the third node N3 and a fourth node N4 to form a feedback loop, and a pass transistor P7 connected between the second and third nodes N2 and N3. The inverter I20 functions as a memory device with the inverter I21 and maintains the logic value on the first node N1. The inverter I20 inverts the logic value on the first node N1 and transmits the inverted logic value to the second node N2.

The pass transistor P7 is selectively driven by the clock signal CLK from the NAND gate NAG5 and by the inverted clock signal from the inverter I22. Namely, the pass transistor P7 transmits the logic value on the second node N2 to the third node N3, when the clock signal CLK is held at the logic "low" level. The pass transistor P7 is driven complementarily to the pass transistor P6 in response to the clock signal CLK, during the counting mode where the enable signal EN and the less significant AND-SUM signal AND-SUMn-1 are all kept at the logic "high" level.

The inverter I23 functions as a memory device with the inverter I24 and maintains the logic value on the third node N3. The inverter I23 inverts the logic value on the third node N3 and transmits the inverted logic value to inverter I25 connected to the fourth node N4. The inverter I24 inverts the logic value on the fourth node N4 and outputs the inverted logic value as the 1-bit internal address signal via the output terminal Bn.

Moreover, the bit counter further includes an AND-SUM operation part 36 which ANDs the logic signal on the third node N3 and the less significant AND-SUM signal AND-SUMn-1. After ANDing the logic signal on the third node N3 and the less significant AND-SUM signal AND-SUMn-1, the AND-SUM operation part 36 generates a new AND-SUM signal AND-SUMn indicating whether or not all the output signals from the less significant bit counters, including an output signal of its own bit counter have data "1". The AND-SUM signal AND-SUMn generated from the AND-SUM operation part 36 has the data "1", only when the logic values of the less significant AND-SUM signal AND-SUMn-1 and on the third node N3 have the data "1". The AND-SUM operation part 36 is comprised of a NAND gate NAG8 and an inverter I16.

Figure 4:
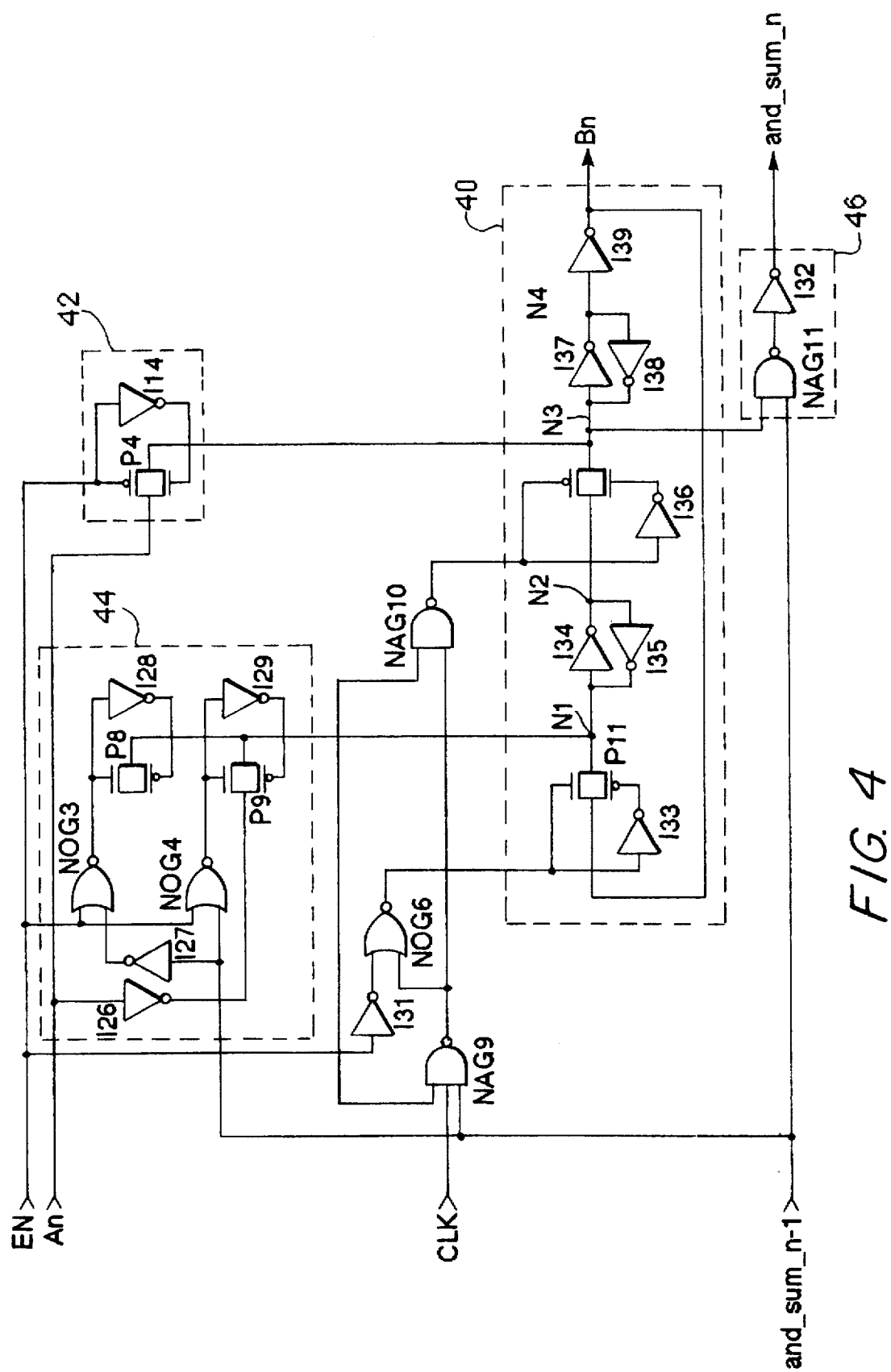
FIG. 4 is a circuit diagram illustrating a bit counter of an internal address generator according to a second embodiment of the present invention.

FIG. 4 is a circuit diagram illustrating a bit counter of an internal address generator according to a second embodiment of the present invention. Referring to FIG. 4, in the circuit, the bit counter is comprised of a NAND gate NAG9 which inputs an enable signal EN, a less significant AND-SUM signal AND-SUMn-1 and a clock signal CLK, respectively, a counter part 40 and a first address switching part 42.

The NAND gate NAG9 inverts the clock signal CLK, only when both the enable signal EN and the less significant AND-SUM signal AND-SUMn-1 are kept in the logic "high" level. The NAND gate NAG9 then supplies the inverted clock signal to a NAND gate NAG10 and a NOR gate NOG6, respectively.

The NAND gate NAG10 inverts the inverted clock signal from the NAND gate NAG9, only when the enable signal EN is maintained at the logic "high" level. Namely, the NAND gate NAG10 together with the NAND gate NAG9 serves to switch the clock signal CLK in accordance with the logic value of the enable signal EN.

The NOR gate NOG6 inverts the inverted clock signal from the NAND gate NAG9, only when the inverted enable signal EN by an inverter 31 is maintained at the logic "low" level. Namely, the NOR gate NOG6 together with the inverter I31 and the NAND gate NAG9 serves to switch the clock signal CLK in accordance with the logic value of the enable signal EN. The output signal from the NOR gate NOG6 has the same waveform as that of NAND gate 10.

The first address switching part 42 selectively transmits an 1-bit address signal An from the exterior of circuit to a third node N3 within the counter part 40 according to the logic value of the enable signal EN. In more detail, in the case where the enable signal EN is kept in the logic "high" level, the first address switching part 42 supplies the external address signal An to the third node N3 within the counter part 40. The first address switching part 42 is comprised of an inverter I30 and a pass transistor P10.

The bit counter within the internal address generator according to the present invention further includes a second address switching part 44 which inputs the less significant AND-SUM signal AND-SUMn-1, the enable signal EN and the inverted clock signal from the NAND gate NAG9. The second address switching part 44 transmits the external address signal An or the inverted external address signal to the first node N1 within the counter part 40 according to the logic value of the less significant AND-SUM signal AND-SUMn-1, during the loading mode where the enable signal EN is kept at the logic "low" level. In more detail, in the case where both the enable signal EN and the less significant AND-SUM signal AND-SUMn-1 are kept at the logic "low" level, the second address switching part 44 transmits the inverted external address signal to the first node N1 within the counter part 40. Meanwhile, in the case that the enable signal EN is kept at the logic "low" level and the less significant AND-SUM signal AND-SUMn-1 is kept at the logic "high" level, the second address switching part 44 transmits the external address signal An to the first node N1 within the counter part 40.

The second address switching part 44 is comprised of inverters I26 and I27 which respectively invert the enable signal EN and the less significant AND-SUM signal AND-SUMn-1 and NOR gates NOG3 and NOG4 which commonly input the enable signal EN. The NOR gate NOG3 NORs the enable signal EN and the less significant AND-SUM signal AND-SUMn-1 inverted via the inverter I27 to thereby generate a first selection signal. The NOR gate NOG4 NORs the enable signal EN and the less significant AND-SUM signal AND-SUMn-1 to thereby generate a second selection signal.

The second address switching part 44 further comprises inverters I28 and I29 which respectively invert the first selection signal from the NOR gate NOG3 and the second selection signal from the NOR gate NOG4 and pass transistors P8 and P9 which respectively input the external address signal An and the inverted external address signal via the inverter I26. The pass transistor P8 selectively switches the external address signal An to the first node N1 within the counter part 40, in response to the first selection signal from the NOR gate NOG3 and the inverted first selection signal from the inverter I28. In particular, in the case where the first selection signal is kept at the logic "high" level, the pass transistor P8 transmits the external address signal An to the first node N1 within the counter part 40. On the other hand, the pass transistor P9 selectively switches the external address signal An inverted by the inverter I29 to the first node N1 within the counter part 40, in response to the second selection signal from the NOR gate NOG4 and the inverted second selection signal from the inverter I29. In particular, in the case where the second selection signal is kept at the logic "high" level, the pass transistor P9 transmits the inverted external address signal to the first node N1 within the counter part 40.

The counter part 40 includes a pass transistor P11 which is connected between an output terminal Bn and the first node N1, an inverter I33 which inverts the clock signal CLK from the NOR gate NOG6 and an inverter I36 which inverts the clock signal from the NAND gate NAG10.

The pass transistor P11 is selectively driven by the clock signal CLK from the NOR gate NOG6 and by the inverted clock signal from the inverter I33. In more detail, the pass transistor P11 transmits the logic value on the output terminal Bn to the first node N1, when the clock signal from the NOR gate NOG6 is held at the logic "high" level.

The counter part 40 further includes parallel-coupled inverters I34 and I35 between the first node N1 and a second node N2 to form a feedback loop, parallel-coupled inverters I37 and I38 between the third node N3 and a fourth node N4 to form a feedback loop, and a pass transistor P12 connected between the second and third nodes N2 and N3. The inverter I34 functions as a memory device with the inverter I35 and maintains the logic value on the first node N1. The inverter I34 inverts the logic value on the first node N1 and transmits the inverted logic value to the second node N2.

The pass transistor P12 is selectively driven by the clock signal CLK from the NAND gate NAG10 and by the inverted clock signal from the inverter I36. Namely, the pass transistor P12 transmits the logic value on the second node N2 to the third node N3, when the clock signal CLK from the NAND gate NAG10 is held at the logic "low" level. The pass transistor P12 is driven complementarily to the pass transistor P6.

The inverter I37 functions as a memory device with the inverter I38 and maintains the logic value on the third node N3. The inverter I37 inverts the logic value on the third node N3 and transmits the inverted logic value to inverter I39 connected to the fourth node N4. The inverter I39 inverts the logic value on the fourth node N4 and outputs the inverted logic value as an 1-bit internal address signal via the output terminal Bn.

Moreover, the bit counter further includes an AND-SUM operation part 46 which ANDs the logic signal on the third node N3 and the less significant AND-SUM signal AND-SUMn-1. After ANDing the logic signal on the third node N3 and the less significant AND-SUM signal AND-SUMn-1, the AND-SUM operation part 46 generates a new AND-SUM signal AND-SUMn indicating whether or not all the output signals from the less significant bit counters, including an output signal of its own bit counter, have data "1". The AND-SUM signal AND-SUMn generated from the AND-SUM operation part 46 has the data "1", only when the logic values of the less significant AND-SUM signal AND-SUMn-1 and on the third node N3 have the data "1". The AND-SUM operation part 46 is comprised of a NAND gate NAG11 which NANDs the logic signal on the third node N3 and the less significant AND-SUM signal AND-SUMn-1 and an inverter I32 which inverts an output signal from the NAND gate NAG11 to thereby output the inverted signal as the AND-SUM signal AND-SUMn.

Figure 5:
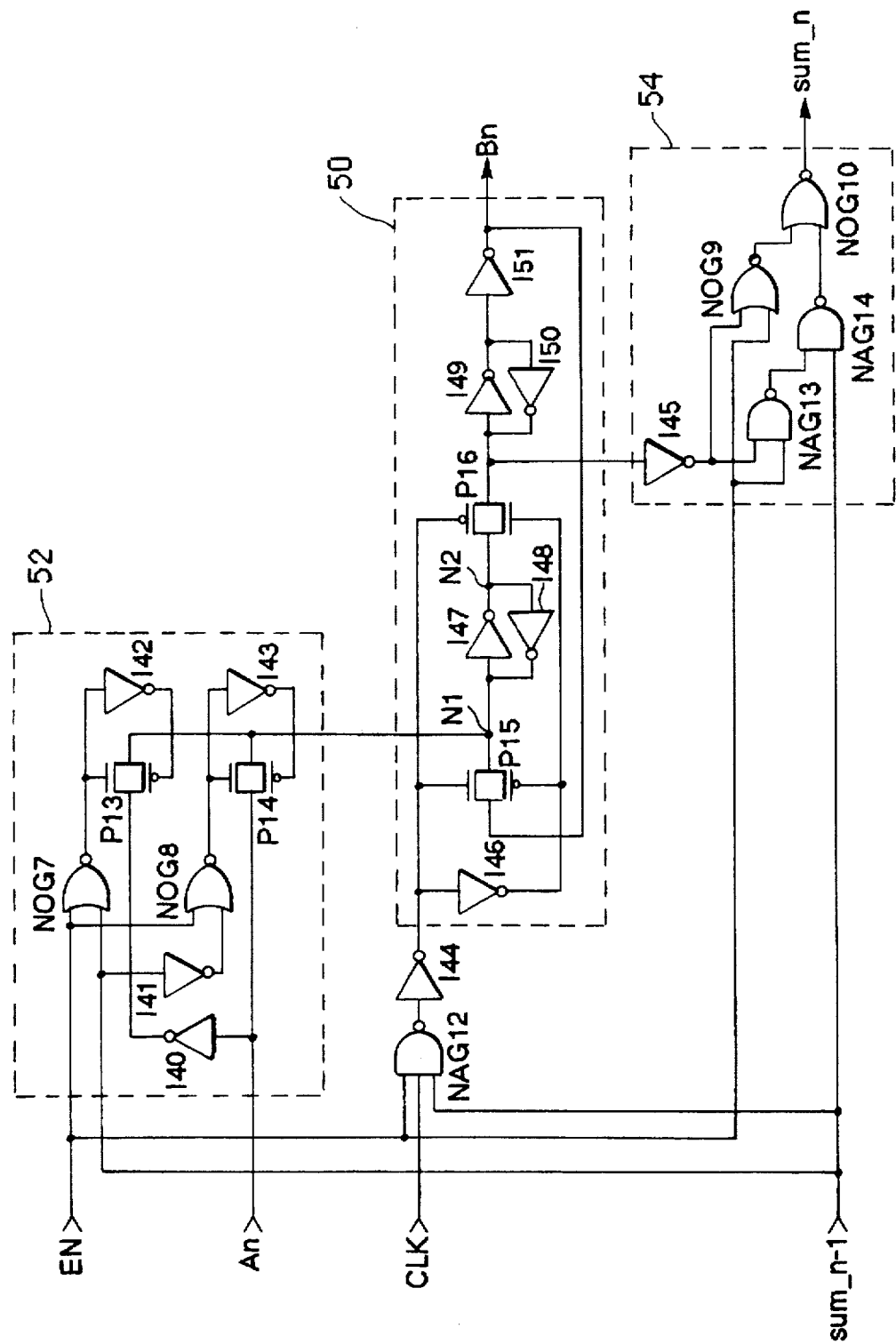
FIG. 5 is a circuit diagram illustrating a bit counter of an internal address generator according to a third embodiment of the present invention.

FIG. 5 is a circuit diagram illustrating a bit counter of an internal address generator according to a third embodiment of the present invention. Referring to FIG. 5, in the circuit, the bit counter is comprised of a NAND gate NAG12 for inputting an enable signal EN, a less significant AND-SUM signal AND-SUMn-1 and a clock signal CLK, respectively, a counter part 50 and an external address switching part 52.

The NAND gate NAG12 inverts the clock signal CLK, only when both the enable signal EN and the less significant AND-SUM signal AND-SUMn-1 are kept at the logic "high" level, and then supplies the inverted clock signal to an inverter I44. The inverter I44 inverts the inverted clock signal from the NAND gate NAG12 and applies the reinverted clock signal to the counter part 50.

The external address switching part 52 transmits the external address signal An or the inverted external address signal to a first node N1 within the counter part 50 according to the logic value of the less significant AND-SUM signal AND-SUMn-1, during the loading mode where the enable signal EN is kept at the logic "low" level. In more detail, in the case where both the enable signal EN and the less significant AND-SUM signal AND-SUMn-1 are kept: at the logic "low" level, the external address switching part 52 transmits the inverted external address signal to the first node N1 within the counter part 50. Meanwhile, in the case that the enable signal EN is kept at the logic "low" level and the less significant AND-SUM signal AND-SUMn-1 is kept at the logic "high" level, the external address switching part 52 transmits the external address signal An to the first node N1 within the counter part 50.

The external address switching part 52 is comprised of inverters I40 and I41 which respectively invert the external address signal An and the less significant AND-SUM signal AND-SUMn-1 and NOR gates NOG7 and NOG8 which commonly input the enable signal EN. The NOR gate NOG8 NORs the enable signal EN and the less significant AND-SUM signal AND-SUMn-1 inverted via the inverter I41 to generate a second selection signal. The NOR gate NOG7 NORs the enable signal EN and the less significant AND-SUM signal AND-SUMn-1 to generate a first selection signal.

The external address switching part 52 further comprises inverters I42 and I43 which respectively invert the first selection signal from the NOR gate NOG7 and the second selection signal from the NOR gate NOG8 and pass transistors P14 and P13 which respectively input the external address signal An and the inverted external address signal via the inverter I40. The pass transistor P13 selectively switches the external address signal An to the first node N1 within the counter part 50, in response to the first selection signal from the NOR gate NOG7 and the inverted first selection signal from the inverter I42. In particular, in the case where the first selection signal is kept at the logic "high" level, the pass transistor P13 transmits the external address signal An to the first node N1 within the counter part 50. On the other hand, the pass transistor P14 selectively switches the external address signal An inverted by the inverter I40 to the first node Ni within the counter part 50, in response to the second selection signal from the NOR gate NOG8 and the inverted second selection signal from the inverter I43. In particular, in the case where the second selection signal is kept at the logic "high" level, the pass transistor P14 transmits the inverted external address signal to the first node N1 within the counter part 50.

The counter part 50 includes a pass transistor P15 which is connected between an output terminal Bn and the first node N1 and an inverter I46 which inverts the clock signal CLK from the inverter I44.

The pass transistor P15 is selectively driven by the clock signal CLK and the inverted clock signal from the inverters I44 and I46, respectively. In more detail, the pass transistor P15 transmits the logic value on the output terminal Bn to the first node N1, when the clock signal CLK is held at the logic "high" level. The first node N1 inputs the internal address signal Bn via the pass transistor P15 and the external address signal An or the inverted external address signal from the external address switching part 52.

The counter part 50 further includes parallel-coupled inverters I47 and I48 between the first node N1 and a second node N2 to form a feedback loop, parallel-coupled inverters I49 and I50 between the third node N3 and a fourth node N4 to form a feedback loop, and a pass transistor P16 connected between the second and third nodes N2 and N3.

The inverter I47 functions as a memory device with the inverter I48 and maintains the logic value on the first node N1. The inverter I47 inverts the logic value on the first node N1 and transmits the inverted logic value to the second node N2.

The pass transistor P16 is selectively driven by the clock signal CLK and the inverted clock signal from the inverters I44 and I46, respectively. Namely, the pass transistor P16 transmits the logic value on the second node N2 to the third node N3, when the clock signal CLK is held at the logic "low" level.

The inverter I49 functions as a memory device with the inverter I50 and maintains the logic value on the third node N3. The inverter I49 inverts the logic value on the third node N3 and transmits the inverted logic value to inverter I51 connected to the fourth node N4. The inverter I51 inverts the logic value on the fourth node N4 and outputs the inverted logic value as an 1-bit internal address signal via the output terminal Bn.

Moreover, the bit counter further includes a SUM operation part 54 which ANDs and ORs the logic signal on the third node N3 and the less significant AND-SUM signal AND-SUMn-1. In the case where the enable signal EN is kept at the logic "high" level, the SUM operation part 54 ANDs the logic signal on the third node N3 and the less significant AND-SUM signal AND-SUMn-1, to generate an AND-SUM signal. In the contrast, in the case where the enable signal EN is kept at the logic "low" level, the SUM operation part 54 ORs the logic signal on the third node N3 and the less significant AND-SUM signal AND-SUMn-1, to generate an OR SUM signal.

The SUM operation part 54 is comprised of an inverter I45 which inverts the logic signal from the third node N3, an NAND gate NAG which inputs the enable signal EN and an NAND gate NAG14 which inputs the less significant AND-SUM signal AND-SUMn-1. The NAND gate NAG13 NANDs the output signal from the inverter I45 and the enable signal EN. Meanwhile, the NAND gate NAG14 NANDs the output signal from the NAND gate NAG13 and the less significant AND-SUM signal AND-SUMn-1.

Further, the SUM operation part 54 includes a NOR gate NOG9 which inputs the enable signal EN and a NOR gate NOG10 which inputs the output signal of the NAND gate NAG14. The NOR gate NOG9 NORs is the output signal from the inverter I45 and the enable signal EN. Meanwhile, the NOR gate NOG10 NORs the output signal from the NOR gate NOG9 and the output signal from the NAND gate NAG14, to generate a SUM signal SUMn. In the case where the enable signal EN is kept at the logic "high" level, the SUM signal SUMn generated from the SUM operation part 54 becomes an AND-SUM signal AND-SUMn indicating whether or not all the output signals from the less significant bit counters, including an output signal of its own bit counter, have data "1". To the contrary, in the case where the enable signal EN is kept at the logic "low" level, the SUM signal SUMn generated from the SUM operation part 54 becomes an OR SUM signal OR-SUMn indicating whether or not all the output signals from the less significant bit counters, including the output signal of its own bit counter, have data "0".

Figure 6:
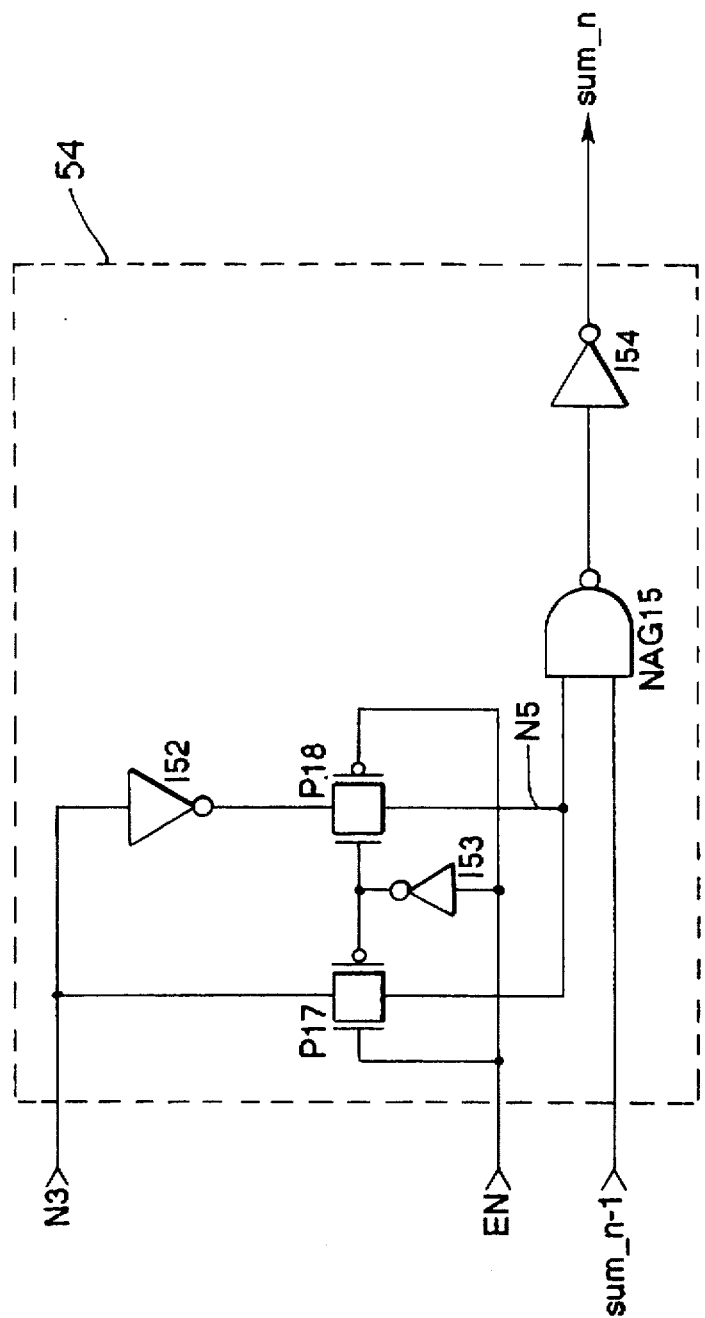
FIG. 6 is a circuit diagram illustrating another embodiment of a SUM operation part of FIG. 5.

FIG. 6 is a circuit diagram illustrating another embodiment of a SUM operation part of FIG. 5. Referring to FIG.

6, the SUM operation part 54 is comprised of an inverter I52 which inputs a logic signal, i.e., the internal address signal Bn from the third node N3 within the counter part 50, an inverter I53 which inverts the enable signal EN, a pass transistor P17 which transmits the internal address signal Bn to a fifth node N5, and a pass transistor P18 which transmits the inverted internal address signal by the inverter I52 to the fifth node N5.

The pass transistor P17 selectively transmits the internal address signal Bn to the fifth node N5, in response to the enable signal EN and the inverted enable signal by the inverter I53. In more detail, the pass transistor P17 transmits the internal address signal Bn to the fifth node N5, in the case where the enable signal EN is held at the logic "high" level.

The pass transistor P18 selectively transmits the inverted internal address signal by the inverter I52 to the fifth node N5, in response to the enable signal EN and the inverted enable signal by the inverter I53. In more detail, the pass transistor P18 transmits the inverted internal address signal to the fifth node N5, in the case where the enable signal EN is held at the logic "high" level.

The SUM operation part 54 is further comprised of a NAND gate NAG15 for inputting a less significant SUM signal SUMn-1. The NAND gate NAG15 NANDs the less significant SUM signal SUMn-1 and the internal address signal on the fifth node N5 and applies the NANDed result to an inverter I54. The inverter I54 inverts an output signal of the NAND gate NAG15 and outputs the inverted signal as the SUM signal SUMn.

Figure 7:
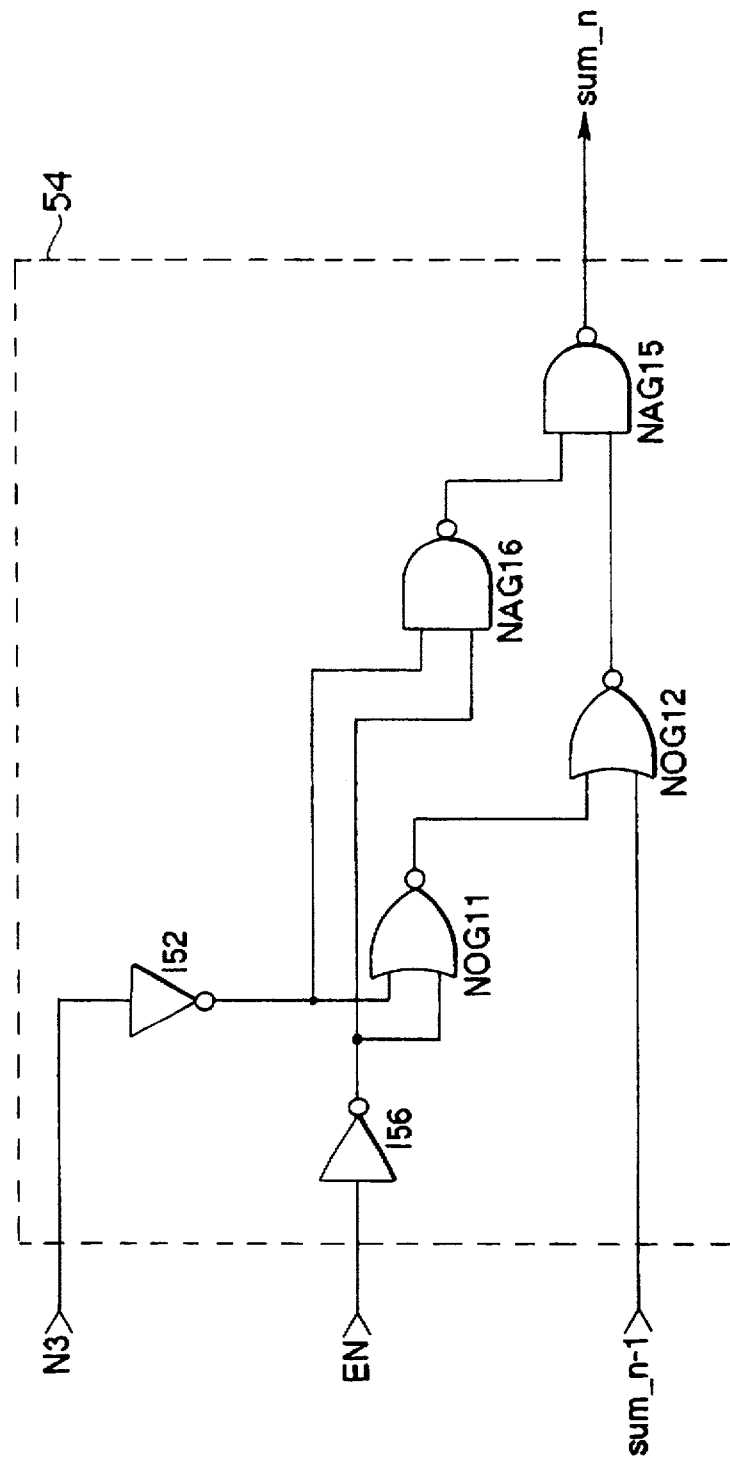
FIG. 7 is a circuit diagram illustrating still another embodiment of a SUM operation part of FIG. 5.

FIG. 7 is a circuit diagram illustrating still another embodiment of a SUM operation part of FIG. 5. Referring to FIG. 7, the SUM operation part 54 is comprised of an inverter I55 which inputs a logic signal, i.e., the internal address signal Bn from the third node N3 within the counter part 50, an inverter I56 which inverts the enable signal EN, a NOR gate NOG11 which inputs output signals from the inverters I55 and I56.

The NOR gate NOG11 NORs the output signals from the inverters I55 and I56 and applies the NORed result to a NOR gate NOG12. The NOR gate NOG12 NORs the less significant SUM signal SUMn-1 and an output signal of the NOR gate NOG11.

The SUM operation part 54 is further comprised of a NAND gate NAG16 for inputting the output signals from the inverters I55 and I56 and a NAND gate NAG17 for inputting an output signal of the NAND gate NAG16 and an output signal of the NOR gate NOG12. The NAND gate NAG16 NANDs the output signals from the inverters I55 and I56, and the NAND gate NAG17 NANDs the output signal of the NAND gate NAG16 and the output signal of the NOR gate NOG12 and applies the NANDed result as the SUM signal SUMn.

Figure 8:
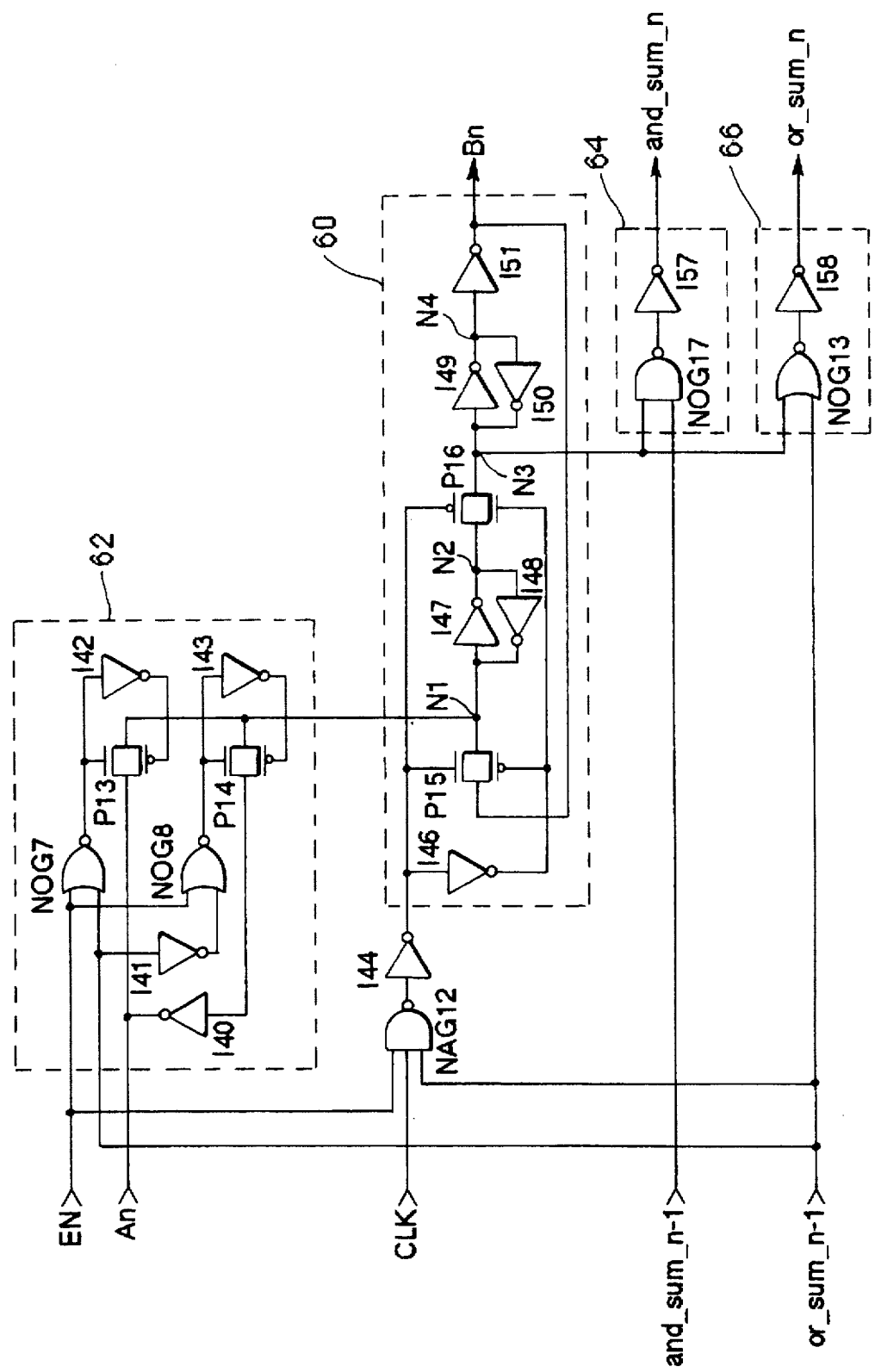
FIG. 8 is a circuit diagram illustrating a bit counter of an internal address generator according to a fourth embodiment of the present invention.

FIG. 8 is a circuit diagram illustrating a bit counter of an internal address generator according to a fourth embodiment of the present invention. Referring to FIG. 8, in the circuit, the bit counter is comprised of a NAND gate NAG12 for inputting an enable signal EN, a less significant AND-SUM signal AND-SUMn-1 and a clock signal CLK, respectively, a counter part 60 and an external address switching part 62.

The NAND gate NAG12 inverts the clock signal CLK, only when both the enable signal EN and the less significant AND-SUM signal AND-SUMn-1 are kept at the logic "high" level, and then supplies the inverted clock signal to an inverter I44. The inverter I44 inverts the inverted clock signal from the NAND gate NAG12 and applies the reinverted clock signal to the counter part 60.

The external address switching part 62 transmits the external address signal An or the inverted external address signal to a first node N1 within the counter part 60 according to the logic value of the less significant OR SUM signal OR-SUMn-1, during the loading mode where the enable signal EN is kept at the logic "low" level. In more detail, in the case where both the enable signal EN and the less significant OR SUM signal OR-SUMn-1 are kept at the logic "low" levels, the external address switching part 62 transmits the external address signal An to the first node N1 within the counter part 60. Meanwhile, in the case that the enable signal EN is kept at the logic "low" level and the less significant OR SUM signal OR-SUMn-1 is kept at the logic "high" level, the external address switching part 62 transmits the inverted external address signal An to the first node N1 within the counter part 60.

The external address switching part 62 is comprised of inverters I40 and I41 which respectively invert the external address signal An and the less significant OR SUM signal OR-SUMn-1 and NOR gates NOG7 and NOG8 which commonly input the enable signal EN. The NOR gate NOG8 NORs the enable signal EN and the less significant OR SUM signal OR-SUMn-1 inverted via the inverter I41 to thereby generate a second selection signal. The NOR gate NOG7 NORs the enable signal EN and the less significant OR SUM signal OR-SUMn-1 to thereby generate a first selection signal.

The external address switching part 62 further comprises inverters I42 and I43 which respectively invert the first selection signal from the NOR gate NOG7 and the second selection signal from the NOR gate NOG8 and pass transistors P14 and P13 which respectively input the external address signal An and the inverted external address signal via the inverter I40. The pass transistor P13 selectively switches the external address signal An to the first node Ni within the counter part 60, in response to the first selection signal from the NOR gate NOG7 and the inverted first selection signal from the inverter I42. In particular, in the case where the first selection signal is kept at the logic "high" level, the pass transistor P13 transmits the external address signal An to the first node N1 within the counter part 60. On the other hand, the pass transistor P14 selectively switches the external address signal An inverted by the inverter I40 to the first node N1 within the counter part 60, in response to the second selection signal from the NOR gate NOG8 and the inverted second selection signal from the inverter I43. In particular, in the case where the second selection signal is kept at the logic "high" level, the pass transistor P14 transmits the inverted external address signal to the first node N1 within the counter part 60.

The counter part 60 includes a pass transistor P15 which is connected between an output terminal Bn and the first node Ni and an inverter I46 which inverts the clock signal CLK from the inverter I44.

The pass transistor P15 is selectively driven by the clock signal CLK and the inverted clock signal from the inverters I44 and I46, respectively. In more detail, the pass transistor P15 transmits the logic value on the output terminal Bn to the first node N1, during the clock signal CLK is held at the logic "high" level. The first node N1 inputs the internal address signal Bn via the pass transistor P15 and the external address signal An or the inverted external address signal from the external address switching part 62.

The counter part 60 further includes parallel-coupled inverters I47 and I48 between the first node N1 and a second node N2 to form a feedback loop, parallel-coupled inverters I49 and I50 between the third node N3 and a fourth node N4 to form a feedback loop, and a pass transistor P16 connected between the second and third nodes N2 and N3.

The inverter I47 functions as a memory device with the inverter I48 and maintains the logic value on the first node N1. The inverter I47 inverts the logic value on the first node N1 and transmits the inverted logic value to the second node N2.

The pass transistor P16 is selectively driven by the clock signal CLK and the inverted clock signal from the inverters I44 and I46, respectively. Namely, the pass transistor P16 transmits the logic value on the second node N2 to the third node N3, during the clock signal CLK is held at the logic "low" level.

The inverter I49 functions as a memory device with the inverter I50 and maintains the logic value on the third node N3. The inverter I49 inverts the logic value on the third node N3 and transmits the inverted logic value to inverter I51 connected to the fourth node N4. The inverter I51 inverts the logic value on the fourth node N4 and outputs the inverted logic value as an 1-bit internal address signal via the output terminal Bn.

Moreover, the bit counter further includes an AND-SUM operation part 64 which ANDs the logic signal on the third node N3 and the less significant AND-SUM signal AND-SUMn-1, and an OR SUM operation part 66 which ORs the logic signal on the third node N3 and the less significant OR SUM signal OR-SUMn-1.

The AND-SUM operation part 64 includes NAND gates NAG17 which NANDs the logic signal on the third node N3 and the less significant AND-SUM signal AND-SUMn-1 and an inverter I57 which inverts an output signal of the NAND gate NAG17 to output the NANDed result as an AND-SUM signal AND-SUMn. The AND-SUM signal AND-SUMn indicates whether or not all the output signals from the less significant bit counters, including an output signal of its own bit counter, have data "1".

The OR SUM operation part 66 includes NOR gates NOG13 which NORs the logic signal on the third node N3 and the less significant OR SUM signal OR-SUMn-1 and an inverter I58 which inverts an output signal of the NOR gate NOG13 to output the NORed result as an OR-SUM signal OR-SUMn. The OR SUM signal OR-SUMn indicates whether or not all the output signals from the less significant bit counters, including an output signal of its own bit counter have data "0".

As described in the above, an internal address generator according to the present invention is capable of simultaneously loading an external address signal to two parts of memory devices within bit counters serial-connected to each other, to immediately execute a counting operation, without having an additional clock. In addition, an internal address generator according to the present invention is capable of performing an operation for AND and/or OR SUM signal during address loading of bit counters, to thereby generate an internal address signal having a high speed response characteristic.

It will be apparent to those skilled in the art that various modifications and variations can be made in an internal address generator of a semiconductor memory device of the present invention without departing from the spirit or scope of the invention. Thus, it is intended that the present invention covers the modifications and variations of this invention provided that they come within the scope of the appended claims and their equivalents.

What is claimed is:

1. An internal address generator having a least two bit counters that receive a less significant AND-SUM signal from another, less significant bit counter from among the at least two bit counters, wherein each bit counter receives an external address signal of 2 or more bits by 1 bit, wherein the bit counters commonly respond to an enable signal for transferring the external address signal, wherein the bit counters commonly respond to a clock signal for activating an internal address counting operation, and wherein each bit counter comprises:
 a) a first pass transistor connected between an output terminal and a first node and being responsive to said clock signal;
 b) a first inverter for inverting a logic value from said output terminal;
 c) a second pass transistor for transmitting an output signal from said first inverter to said first node;
 d) second and third inverters parallel-coupled between said first node and a second node to form a feedback loop;
 e) fourth and fifth inverters parallel-coupled between third and fourth nodes to form a feedback loop;
 f) a third pass transistor connected between said second and third nodes;
 g) a sixth inverter connected between said fourth node and said output terminal;
 h) a clock switching part for transmitting said clock signal to said third pass transistor during a counter mode in accordance with logic values of said enable signal and said less significant AND-SUM signal;
 i) an address switching part for selectively transmitting an external address signal to said third node in accordance with the logic value of said enable signal;
 j) a loop switching part for applying said clock signal to said first pass transistor to drive the first pass transistor complementarily to the third pass transistor during the count mode, and to complementarily drive said first and second pass transistors during a loading mode, in response to the logic values of said enable signal and said less significant AND-SUM signal; and
 k) an AND-SUM operation part for generating an AND-SUM signal by a logic signal on said third node and said less significant AND-SUM signal.

2. The internal address generator as claimed in claim 1, wherein said address switching part transmits said external address signal to said third node, in the case where said enable signal is kept at the logic "low" level.

3. The internal address generator as claimed in claim 1, wherein said loop switching part drives said second pass transistor, only in the case where said enable signal and said less significant AND-SUM signal are all kept at the logic "low" level.

4. The internal address generator as claimed in claim 1, wherein said loop switching part drives said first pass transistor complementarily to said third pass transistor, in the case where said enable signal is kept at the logic "high" level, and drives said first pass transistor, in the case where said enable signal is kept to the logic "low" level and said less significant AND-SUM signal is kept at the logic "high" level.

5. The internal address generator as claimed in claim 1, wherein said bit counter comprises:
 a clock switching part for transmitting said clock signal during the counter mode in accordance with the logic values of said enable signal and said less significant AND-SUM signal;
 a first pass transistor connected between the output terminal and the first node and being responsive to said clock signal from said clock switching part;

first and second inverters parallel-coupled between the first and second nodes to form a feedback loop;

third and fourth inverters parallel-coupled between the third and fourth nodes to form a feedback loop;

a second pass transistor connected between said second and third nodes and driven complementarily to said first pass transistor in response to said clock signal from said clock switching part;

a fifth inverter connected between said fourth node and said output terminal;

a first address switching part for selectively transmitting the external address signal to the third node in accordance with the logic value of said enable signal;

a second address switching part for transmitting the external address signal and/or the inverted external address signal to the first node in accordance with the logic values of said enable signal and said less significant AND-SUM signal; and an AND-SUM operation part for generating an AND-SUM signal by the logic signal on said third node and said less significant AND-SUM signal.

6. The internal address generator as claimed in claim 5, wherein said first and second address switching parts are driven only in the case where said enable signal is kept at the logic "low" level.

7. The internal address generator as claimed in claim 6, wherein said second address switching part inverts the external address signal and applies the inverted external address signal to the first node, in the case where the less significant AND-SUM signal is kept at the logic "low" level, and applies the external address signal to the first node, in the case where the less significant AND-SUM signal is kept at the logic "high" level.

8. An internal address generator having a least two bit counters that receive a less significant AND-SUM signal and a less significant OR-SUM signal from another, less significant bit counter from among the at least two bit counters, wherein each bit counter receives an external address signal of 2 or more bits by 1 bit, wherein the bit counters commonly respond to an enable signal for transferring the external address signal, wherein the bit counters commonly respond to a clock signal for activating an internal address counting operation, and wherein each bit counter comprises:

a) a clock switching part for transmitting said clock signal during a counter mode in accordance with logic values of said enable signal and said less significant AND-SUM signal;

b) a first pass transistor connected between an output terminal and a first node and being responsive to said clock signal from said clock switching part;

c) first and second inverters parallel-coupled between the first node and a second node to form a feedback loop;

d) third and fourth inverters parallel-coupled between third and fourth nodes to form a feedback loop;

e) a second pass transistor connected between said second and third nodes and driven complementarily to said first pass transistor in response to said clock signal from said clock switching part;

f) a fifth inverter connected between said fourth node and said output terminal;

g) a first address switching part for selectively transmitting the external address signal to the third node in accordance with the logic value of said enable signal;

h) a second address switching part for transmitting the external address signal and/or an inverted external address signal to the first node in accordance with logic values of said enable signal and said less significant OR-SUM signal;

i) an AND-SUM operation part for generating an AND-SUM signal by a logic signal on said third node and said less significant AND-SUM signal; and j) an OR-SUM operation part for generating an OR-SUM signal by the logic signal on said third node and said less significant OR-SUM signal.

9. An internal address generator having a least two bit counters that receive a less significant SUM signal from another, less significant bit counter from among the at least two bit counters, wherein each bit counter receives an external address signal of 2 or more bits by 1 bit, wherein the bit counters commonly respond to an enable signal for transferring the external address signal, wherein the bit counters commonly respond to a clock signal for activating an internal address counting operation, and wherein each bit counter comprises:

a) a clock switching part for transmitting said clock signal during a counter mode in accordance with logic values of said enable signal and said less significant SUM signal;

b) a first pass transistor connected between an output terminal and a first node and being responsive to said clock signal from said clock switching part;

c) first and second inverters parallel-coupled between the first node and a second node to form a feedback loop;

d) third and fourth inverters parallel-coupled between third and fourth nodes to form a feedback loop;

e) a second pass transistor connected between said second and third nodes and driven complementarily to said first pass transistor in response to said clock signal from said clock switching part;

f) a fifth inverter connected between said fourth node and said output terminal;

g) a first address switching part for selectively transmitting the external address signal to the third node in accordance with the logic value of said enable signal;

h) a second address switching part for transmitting the external address signal and/or an inverted external address signal to the first node in accordance with logic values of said enable signal and said less significant SUM signal; and i) a SUM operation part for selectively generating an ADD-SUM signal and an OR-SUM signal by a logic signal on said third node and said less significant SUM signal, in response to said enable signal.

10. The internal address generator as claimed in claim 9, wherein said SUM operation part generates said OR SUM signal, in case where said enable signal is kept at the logic "high" level, and contrarily, generates said AND-SUM signal, in case the where said enable signal is kept at the logic "low" level.

* * * * *